United States Patent
Mochikawa et al.

(10) Patent No.: US 8,089,780 B2
(45) Date of Patent: Jan. 3, 2012

(54) SEMICONDUCTOR SWITCH AND POWER CONVERSION SYSTEM PROVIDED WITH SEMICONDUCTOR SWITCH

(75) Inventors: Hiroshi Mochikawa, Hachioji (JP); Tateo Koyama, Hanno (JP); Atsuhiko Kuzumaki, Kodaira (JP); Junichi Tsuda, Fuchu (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 323 days.

(21) Appl. No.: 12/526,053

(22) PCT Filed: Feb. 4, 2008

(86) PCT No.: PCT/JP2008/051770
§ 371 (c)(1),
(2), (4) Date: Aug. 6, 2009

(87) PCT Pub. No.: WO2008/096709
PCT Pub. Date: Aug. 14, 2008

(65) Prior Publication Data
US 2010/0321966 A1    Dec. 23, 2010

(30) Foreign Application Priority Data
Feb. 6, 2007   (JP) ................................. 2007-026751

(51) Int. Cl.
*H02M 3/335*   (2006.01)
(52) U.S. Cl. .......................................... 363/17; 363/132
(58) Field of Classification Search ............. 363/17, 363/56.02, 132
See application file for complete search history.

(56) References Cited

U.S. PATENT DOCUMENTS

| | | | |
|---|---|---|---|
| 4,275,359 A | | 6/1981 | Yoshida et al. |
| 6,137,703 A | * | 10/2000 | Julian et al. .................... 363/127 |
| 6,226,192 B1 | * | 5/2001 | Yamanaka et al. .......... 363/56.01 |
| 6,459,596 B1 | * | 10/2002 | Corzine ........................... 363/37 |
| 6,838,925 B1 | * | 1/2005 | Nielsen .......................... 327/391 |
| 7,313,008 B2 | * | 12/2007 | Steimer ............................ 363/98 |

FOREIGN PATENT DOCUMENTS

DE         10204882 A1    8/2003
(Continued)

OTHER PUBLICATIONS

Office Action dated Dec. 20, 2010, in Korean Patent Application No. 10-2009-7016287.

(Continued)

*Primary Examiner* — Shawn Riley
(74) *Attorney, Agent, or Firm* — Oblon, Spivak, McClelland, Maier & Neustadt, L.L.P.

(57) ABSTRACT

A semiconductor switch is provided with a main element having reverse conductivity and serving as a voltage-driven switching element having a high withstand voltage, an auxiliary element serving as a voltage-driven switching element having a withstand voltage lower than that of the main element, and a high-speed freewheel diode having a withstand voltage equal to that of the main element, wherein a negative pole of the main element is connected to a negative pole of the auxiliary element to define the positive pole of the main element as a positive pole terminal and the positive pole of the auxiliary element as a negative pole terminal, and the high-speed freewheel diode is parallel-connected between the positive pole terminal and the negative pole terminal so that a direction from the negative pole terminal toward the positive pole terminal constitutes a forward direction.

14 Claims, 9 Drawing Sheets

FOREIGN PATENT DOCUMENTS

| | | |
|---|---|---|
| JP | 54 134547 | 10/1979 |
| JP | 1 125018 | 5/1989 |
| JP | 5 243945 | 9/1993 |
| JP | 5 268762 | 10/1993 |
| JP | 8 294286 | 11/1996 |
| JP | 10-285907 | 10/1998 |
| JP | 11 356045 | 12/1999 |
| JP | 2000-50625 | 2/2000 |
| JP | 2001 245479 | 9/2001 |
| JP | 2006 158185 | 6/2006 |
| JP | 2007-305836 | 11/2007 |

OTHER PUBLICATIONS

Office Action issued Oct. 10, 2011, in Chinese Patent Application No. 200880007881.2 (with English Translation).

* cited by examiner

SEMICONDUCTOR SWITCH AND POWER CONVERSION SYSTEM PROVIDED WITH SEMICONDUCTOR SWITCH

TECHNICAL FIELD

The present invention relates to a semiconductor switch and a power conversion system and, more particularly, to a semiconductor switch for suppressing a reverse recovery current of a freewheel diode in a power conversion circuit having a configuration in which the freewheel diode is connected in inverse parallel with a main-circuit switching element, and also relates to a power conversion system applying the semiconductor switch.

BACKGROUND ART

Conventionally, as a power conversion circuit having a configuration in which a freewheel diode is connected in inverse parallel with a switching element in a main circuit, there has been proposed a power conversion circuit in which a loss caused as the result of the reverse recovery current of the freewheel diode being turned on is reduced. Such a power conversion system having a power conversion circuit is disclosed in, for example, Japanese Patent Laid-Open No. 2006-141167 (Patent Document 1) and Japanese Patent Laid-Open No. 2006-141168 (Patent Document 2).

However, in such a conventional power conversion system as disclosed in Patent Document 1 or Patent Document 2, a large current of a main circuit temporarily flows into an additional circuit at the time of reverse recovery of the freewheel diode, thus causing an increase in the scale of the additional circuit. Consequently, the conventional power conversion system has a problem that a relatively large-capacity auxiliary power supply having a relatively large capacity alkalis required. In addition, there arises the need for a logic circuit for generating the gate pulse signal of a switching element used in the additional circuit. Accordingly, the conventional power conversion system provides a problem that the circuitry thereof becomes complicated. Furthermore, the switching element used in the additional circuit needs to be enabled during a dead-time period of the main circuit. This causes timing constraints to tighten and, therefore, makes the power conversion system unsuited for high-speed switching.

DISCLOSURE OF THE INVENTION

The present invention has been accomplished in order to solve the above-described problems. It is therefore an object of the present invention to provide a semiconductor switch reduced further in loss and increased in switching speed by effectively suppressing the reverse recovery current of a freewheel diode, while simplifying a circuit configuration, and to provide a power conversion system applying the semiconductor switch.

In order to solve the above-described problems, a semiconductor switch in accordance with the present invention is characterized by comprising: a main element having reverse conductivity and serving as a voltage-driven switching element having a high withstand voltage; an auxiliary element serving as a voltage-driven switching element having a withstand voltage lower than that of the main element; and a high-speed freewheel diode having a withstand voltage equal to that of the main element, wherein a negative pole of the main element is connected to a negative pole of the auxiliary element to define the positive pole of the main element as a positive pole terminal and the positive pole of the auxiliary element as a negative pole terminal, and the high-speed freewheel diode is parallel-connected between the positive pole terminal and the negative pole terminal so that a direction from the negative pole terminal toward the positive pole terminal is a forward direction.

The main element may be comprised of a MOSFET.

In addition, the auxiliary element may be comprised of a FET.

The high-speed freewheel diode may be configured by series-connecting a plurality of high-speed freewheel diodes in order to realize a withstand voltage equal to that of the main element.

The high-speed freewheel diode may be a diode manufactured using a semiconducting material with a forbidden band wider than that of silicon.

A capacitor may be parallel-connected across the positive and negative poles of the auxiliary element.

Likewise, a diode, the forward direction of which is a direction from the negative pole toward the positive pole of the auxiliary element, may be parallel-connected across the positive and negative poles of the auxiliary element.

The output side of a gate driver, to which a common gate signal is input, may be connected to the gate terminals of the main element and the auxiliary element.

A voltage clamping circuit may be connected in a direction from the negative pole terminal to the positive pole side of a power supply of the gate driver.

In addition, semiconductor chips of the main element, the auxiliary element and the high-speed freewheel diode may be integrally formed on a single substrate.

Furthermore, in order to solve the above-described problems, a power conversion system in accordance with the present invention is characterized in that in a bridge circuit configured by series-connecting two switching elements to a DC main power supply, at least a switching element on the positive pole side of the two switching elements is configured by applying any one of the above-described semiconductor switches.

Still furthermore, in order to solve the above-described problems, a power conversion system in accordance with the present invention is characterized in that in a multiphase bridge circuit having a plurality of bridge circuits, each being configured by series-connecting two switching elements to a DC main power supply, at least a switching element on the negative pole side of the two switching elements is configured by applying any one of the above-described semiconductor switches, and the gate-driving power supply of the switching element on the negative pole side is made common, so that power is supplied to each phase from a single power supply through a resistor, or power is supplied to each phase from a single power supply through a switch.

Still furthermore, in order to solve the above-described problems, a power conversion system in accordance with the present invention is characterized in that in a bridge circuit having at least two bridge circuits, each being configured by series-connecting two switching elements to a DC main power supply, at least one of the bridge circuits is configured by applying any one of the above-described semiconductor switches to the two switching elements, so that the switching frequency of the bridge circuit is higher than those of other bridge circuits.

According to the present invention, it is possible to more effectively suppress the reverse recovery current of a freewheel diode, while making a circuit configuration simpler in comparison with a conventional technology. Accordingly, it is possible to provide a semiconductor switch in which loss is further reduced, and a power conversion system applying the semiconductor switch. In addition, since the present invention is free from conventional constraints on switching timing, it is possible to provide a semiconductor switch having a switching speed higher than that in the conventional technology, and also provide a power conversion system applied with the semiconductor switch.

BEST MODE FOR CARRYING OUT THE INVENTION

Hereinafter, embodiments of a semiconductor switch and a power conversion system applying the semiconductor switch in accordance with the present invention will be described with reference to the accompanying drawings.

First Embodiment

Figure 1:
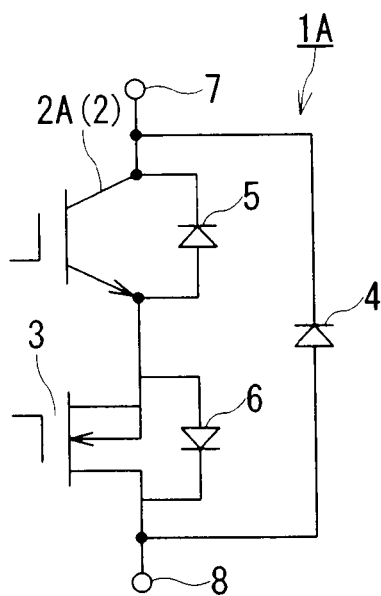
FIG. 1 is a circuit diagram illustrating a circuit configuration of a semiconductor switch in accordance with a first embodiment of the present invention.

FIG. 1 is a circuit diagram illustrating a circuit configuration of a semiconductor switch 1A in accordance with a first embodiment of the present invention.

The semiconductor switch 1A is configured by connecting an auxiliary element 3 in series with a main element 2 serving as a switching element of a commonly-used power conversion circuit and by connecting a high-speed freewheel diode 4 having the same voltage resistance (withstand voltage) as that of the main element 2 in inverse parallel with the series connection of the main element 2 and the auxiliary element 3. That is, the semiconductor switch 1A is configured by adding an additional circuit comprising the auxiliary element 3 and the high-speed freewheel diode 4 to the main element 2.

The main element 2 of the semiconductor switch 1A is a highly voltage-resistant, voltage-driven element high in voltage resistance (withstand voltage) and an IGBT 2A containing a reverse-conducting diode 5, for example, is applied thereto. The withstand voltage of the main element 2 is a realizable voltage, preferably 100 V or higher, more preferably 200 V or higher, and even more preferably 250 V or higher. Under normal conditions, an element having a withstand voltage of 250 V or higher is used.

The auxiliary element 3 is a voltage-driven element having voltage resistance (withstand voltage) approximately half or lower, compared with the withstand voltage of the main element 2. A low-voltage MOSFET having a withstand voltage of several tens of volts, for example, is applied to the auxiliary element 3.

Here, reference numeral 6 denotes the parasitic diode of a MOSFET 3. The reverse-conducting diode 5 and the parasitic diode 6 realize the reverse conductivity of the IGBT 2A (main element 2) and the low-voltage MOSFET (auxiliary element) 3. In addition, the high-speed freewheel diode 4 refers to a diode smaller in chip area, larger in forward voltage drop, and superior in reverse recovery characteristic, compared with the reverse-conducting diode 5 built in the main element 2.

A connection between the main element 2 and the auxiliary element 3 is made by connecting the emitter of the IGBT 2A (main element 2) corresponding to the negative pole thereof and the source terminal of the low-voltage MOSFET (auxiliary element) 3 corresponding to the negative pole thereof. That is, the collector of the IGBT 2A corresponding to the positive pole of the main element 2 is defined as a positive pole terminal 7, and the drain terminal of the low-voltage MOSFET 3 corresponding to the positive pole of the auxiliary element 3 is defined as a negative pole terminal 8. The high-speed freewheel diode 4 is connected, so that a direction from the negative pole terminal 8 toward the positive pole terminal 7 is a forward direction ("p" pole→"n" pole).

Next, an explanation will be made of the gate timing of the main element 2 and the auxiliary element 3 of the semiconductor switch 1A.

The semiconductor switch 1A operates as it receives a gate signal from a gate driver not illustrated in FIG. 1. The gate signal is provided in synchronization with the on/off timing of the main element 2 and in such timing as to also turn on/off the auxiliary element 3. That is, when an ON signal is applied to the gate of the main element 2, an ON signal is also applied to the gate of the auxiliary element 3. On the contrary, when an OFF signal is applied to the gate of the main element 2, an OFF signal is also applied to the gate of the auxiliary element 3. Although some timing error is involved in practice, the main element 2 and the auxiliary element 3 perform switching in synchronization with each other.

The semiconductor switch 1A will attain the following functions and effects.

In the semiconductor switch 1A which is configured as illustrated in FIG. 1 and the gate timing of which is controlled, it is possible to suppress an increase in conduction resistance to an extremely small amount by using a MOSFET having a sufficiently low withstand voltage (for example, several tens of volts) for the auxiliary element 3. In addition, by using the MOSFET having a sufficiently low withstand voltage for the auxiliary element 3, it is possible to make smaller the semiconductor chip of the auxiliary element 3, while lowering the conduction resistance thereof. This is attributable to the conduction resistance characteristic of the MOSFET (described later as Expression 1).

It is generally known that as shown in Expression (1) given below, the conduction resistance Ron of MOSFETs is proportional to approximately the 2.5th power of an element withstand voltage V and is inversely proportional to a chip area S. Here, "k" in the right-hand member of Expression (1) denotes a constant of proportionality.

[Expression 1]

$$R_{on} \approx k \cdot \frac{V^{2.5}}{S} \quad (1)$$

That is, in consideration on the basis of Expression (1) given above, the 2.5th power of the element withstand voltage V is substantially proportional to a product of the conduction resistance Ron and the chip area S. For example, if the element withstand voltage V is decreased to $\frac{1}{5}$ times the value thereof, then the product of the conduction resistance Ron and the chip area S can be decreased to the 2.5th power of $\frac{1}{5}$ (approximately $\frac{1}{56}$). If the conduction resistance is decreased to $\frac{1}{7}$ times the value thereof, then the chip area can also be decreased concurrently to approximately $\frac{1}{8}$ times the value thereof, thereby making the semiconductor chip smaller.

When a main current is flowing in a forward direction, i.e., from the positive pole terminal 7 toward the negative pole terminal 8, the semiconductor switch 1A is in an extremely low-resistance state since an ON signal is also applied to the gate of the auxiliary element 3. When the main current is flowing in a reverse direction, i.e., from the negative pole terminal 8 toward the positive pole terminal 7, the semiconductor switch 1A is also in an extremely low-resistance state since an ON signal is also applied to the gate of the auxiliary element 3. Thus, the main current flowing in from the negative pole terminal 8 passes through the auxiliary element 3 to the reverse-conducting diode 5 built in the main element 2 and flows into the positive pole terminal 7.

If the main element 2 is gated off at this time, the auxiliary element 3 is also gated off in synchronization. Thus, the main current is no longer able to pass through the auxiliary element 3. As a result, the main current is forced to be commutated to the high-speed freewheel diode 4 having a large forward voltage drop. In a moment before the completion of this commutation, a surge voltage is temporarily applied between the drain and source terminals of the low-voltage MOSFET 3 serving as the auxiliary element 3. In general, a withstand voltage of several tens of volts is sufficient to withstand this surge voltage. Even if a surge voltage exceeding the withstand voltage should be applied during an extremely short period of time, i.e., even if a surge voltage exceeding the withstand voltage is applied in a moment before the completion of commutation, the MOSFET 3 can withstand the surge voltage since the MOSFET 3 has more or less has avalanche resistance.

Accordingly, even if one semiconductor switch 1A turns on in a bridge circuit in which two complementarily operating semiconductor switches 1A are series-connected to the DC main circuit, a reverse recovery current does not flow through the reverse-conducting diode 5 once a main current is commutated to the high-speed freewheel diode 4 in the other (turned-off) semiconductor switch 1A. Thus, a reverse recovery phenomenon is effectively suppressed.

According to the semiconductor switch 1A, it is possible to reduce loss caused as the result of a reverse recovery current flowing through the reverse-conducting diode 5 connected in inverse parallel with the main element 2. Furthermore, since this leads to a reduction in switching loss, the high-speed switching will become possible. Still furthermore, it is possible to minimize the chip areas of the auxiliary element 3 and the high-speed freewheel diode 4 added to a commonly-used semiconductor switch (corresponds to the main element 2). In addition, these components do not require any additional power supplies and, therefore, it is possible to configure the added circuits (auxiliary element 3 and high-speed freewheel diode 4) to be small in size and low in cost.

Second Embodiment

Figure 2:
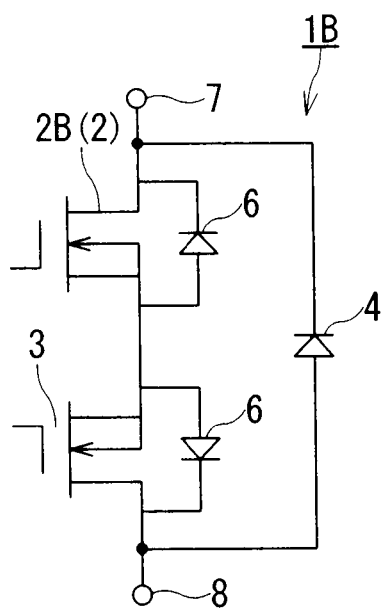
FIG. 2 is a circuit diagram illustrating a circuit configuration of a semiconductor switch in accordance with a second embodiment of the present invention.

FIG. 2 is a circuit diagram illustrating a circuit configuration of a semiconductor switch 1B in accordance with a second embodiment of the present invention.

According to FIG. 2, the semiconductor switch 1B differs from the semiconductor switch 1A described in the first embodiment in that a MOSFET 2B is used for the main element 2 in place of the IGBT 2A. However, these semiconductor switches do not differ substantially in the rest of the configuration. Hence, components which do not substantially differ from those of the semiconductor switch 1A are denoted by like reference numerals and will not be explained again.

In cases where a MOSFET is applied as a main element, the reverse recovery characteristic of a reverse-conducting PN diode (parasitic diode), which is parasitically formed inside the MOSFET for reasons of the semiconductor structure of the MOSFET, becomes a problem. That is, there arises a problem that reverse recovery is extremely slow. In general, in order to improve the reverse recovery characteristic of the parasitic diode 6, treatments for improving the reverse recovery characteristic, such as a process of diffusing heavy metal (for example, platinum) and a process of irradiating electron beams or neutrons, need to be carried out in a process of semiconductor manufacturing. However, performing the treatments for improving the reverse recovery characteristic brings the unfavorable result that conduction resistance increases in exchange for improvements in the reverse recovery characteristic.

On the other hand, the semiconductor switch 1B illustrated in FIG. 2 is configured by applying the MOSFET 2B in which a process of diffusing heavy metal has not been performed. In the same way as the semiconductor switch 1A, the semiconductor switch 2B is controlled to such gate timing that the low-voltage MOSFET (auxiliary element) 3 also turns on/off in synchronization with the on/off timing of the MOSFET 2B (main element 2). Accordingly, once a main current is commutated to the high-speed freewheel diode 4, a reverse recovery current does not flow through the parasitic diode 6 of the MOSFET 2B. Thus, a reverse recovery phenomenon is effectively suppressed.

In the semiconductor switch 1B, conduction resistance is a sum of the conduction resistance of the auxiliary element 3 and the conduction resistance of the main element 2. However, the conduction resistance of the auxiliary element 3 to be added (incremental conduction resistance) is kept to an extremely marginal amount by selecting a sufficiently low voltage for the withstand voltage of the auxiliary element 3.

Furthermore, the use of the MOSFET 2B for the main element 2 shortens a delay time before the turning off thereof. Consequently, it is possible to shorten a delay time before the other complementarily operating semiconductor switch 1B turns on, i.e., a dead time, in a bridge circuit in which two complementarily operating semiconductor switches 1B are series-connected to the DC main circuit.

As described above, according to the semiconductor switch 1B, it is possible to realize a remarkable improvement in the reverse recovery characteristic without performing treatments, such as a step of diffusing heavy metal, even if the high-withstand voltage, low-resistance MOSFET 2B is used for the main element 2. Furthermore, loss involved in switching can be reduced further since it is possible to shorten the current-carrying time of the high-speed freewheel diode 4 large in conduction loss. Still furthermore, since the dead time can be shortened, it is possible to reduce a degradation (waveform deterioration) in the control quality of a power conversion circuit.

Third Embodiment

Figure 3:
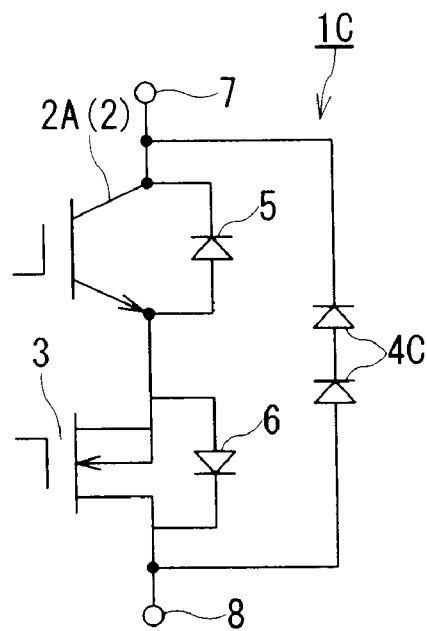
FIG. 3 is a circuit diagram illustrating a circuit configuration of a semiconductor switch in accordance with a third embodiment of the present invention.

FIG. 3 is a circuit diagram illustrating a circuit configuration of a semiconductor switch 1C in accordance with a third embodiment of the present invention.

According to FIG. 3, the semiconductor switch 1C differs from the semiconductor switch 1A described in the first embodiment in that a plurality of high-speed freewheel diodes 4C (two in the example illustrated in FIG. 3) are used in place of the high-speed freewheel diode 4. However, these semiconductor switches do not differ substantially in the rest of the configuration. Hence, components which do not differ from those of the semiconductor switch 1A are denoted by like reference numerals and will not be explained again.

In general, the reverse recovery characteristic of a diode degrades with an increase in the withstand voltage thereof. Hence, the semiconductor switch 1C illustrated in FIG. 3 is configured by series-connecting two high-speed freewheel diodes 4C having a withstand voltage approximately half that of the high-speed freewheel diode 4.

By configuring the semiconductor switch 1C in this way by series-connecting two high-speed freewheel diodes 4C fast in reverse recovery but low in withstand voltage, although a voltage drop at the time of conduction increases, it is possible to promptly settle the reverse recovery which occurs at a point in time when the other complementarily operating semiconductor switch turns on.

Further, although the voltage drop at the time of conduction increases to the amount of two diodes of drop in the semiconductor switch 1C illustrated in FIG. 3, the high-speed freewheel diodes 4C conducts only during a dead-time period in which the main current flows from the negative pole terminal 8 toward the positive pole terminal 7. Therefore, the ratio of conduction time is extremely low and incremental conduction loss is also marginal.

According to the semiconductor switch 1C, it is possible to further reduce the loss caused as the result of a reverse recovery current being turned on, in comparison with the semiconductor switch 1A, thereby providing further advantage in addition to advantages available in the semiconductor switch 1A. Thus, high-speed switching becomes possible.

Furthermore, although an explanation has been made of an example in which the semiconductor switch 1C illustrated in FIG. 3 is configured by series-connecting the two high-speed freewheel diodes 4C having a withstand voltage approximately half that of the high-speed freewheel diode 4, the number of high-speed freewheel diodes 4C may be set arbitrarily. That is, assuming that the number is "n" ("n" is a natural number equal to or larger than 2), the semiconductor switch 1C can be configured by series-connecting "n" high-speed freewheel diodes 4C having a withstand voltage approximately 1/n times that of the high-speed freewheel diode 4.

Fourth Embodiment

Figure 4:
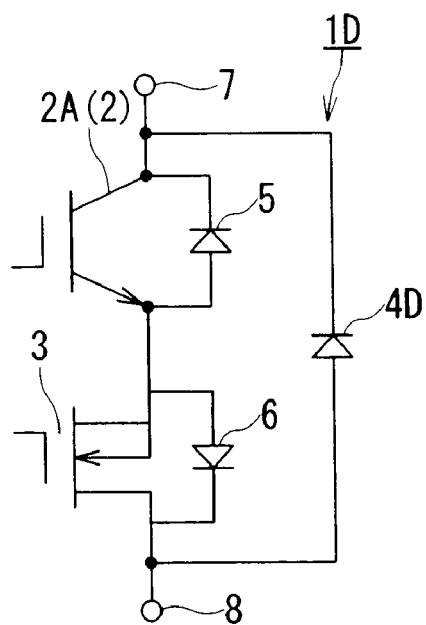
FIG. 4 is a circuit diagram illustrating a circuit configuration of a semiconductor switch in accordance with a fourth embodiment of the present invention.

FIG. 4 is a circuit diagram illustrating a circuit configuration of a semiconductor switch 1D in accordance with a fourth embodiment of the present invention.

According to FIG. 4, the semiconductor switch 1D differs from the semiconductor switch 1A described in the first embodiment in that a high-speed freewheel diode 4D, the material of which is a semiconductor (wide-gap semiconductor) having a forbidden band wider than silicon, is used in place of the high-speed freewheel diode 4. However, these semiconductor switches do not differ substantially in the other structure thereof. Hence, components which do not substantially differ from those of the semiconductor switch 1A are denoted by like reference numerals and will not be explained again herein.

In the semiconductor switch 1D, there is applied the high-speed freewheel diode 4D formed of a semiconducting material (wide-gap semiconductor, such as silicon carbide, gallium nitride, gallium arsenide, or diamond) having a forbidden band wider than silicon, as illustrated in FIG. 4.

According to the semiconductor switch 1D configured as described above, it is possible to obtain characteristic feature of an even higher withstand voltage and fast reverse recovery, by applying a diode (high-speed freewheel diode 4D) made of a semiconductor having a forbidden band wider than silicon as the high-speed freewheel diode. The semiconductor materials having the wider forbidden bands are more expensive than a silicon semiconductor. However, the semiconductor switch 1D is configured so that the high-speed freewheel diode 4D conducts only during an extremely short period of dead time. Thus, the semiconductor switch 1D requires only a small chip area. That is, the reverse recovery performance can be improved by using only a small amount of expensive semiconductor, thus attaining significant effect.

In addition, high-speed switching becomes possible since loss caused as the result of a reverse recovery current being turned on can be reduced significantly. Further, in the semiconductor switch 1D illustrated in FIG. 4, the high-speed freewheel diode 4D is applied in place of the high-speed freewheel diode 4 of the semiconductor switch 1A described in the first embodiment. Alternatively, the high-speed freewheel diode 4D may be applied in place of the high-speed freewheel diodes 4 and 4C of the semiconductor switch 1B and other semiconductor switches.

Fifth Embodiment

Figure 5:
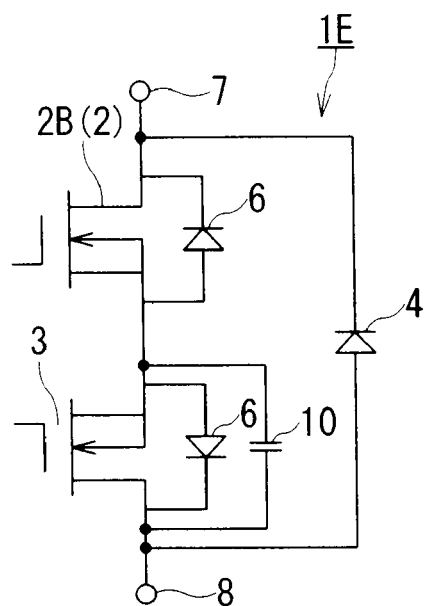
FIG. 5 is a circuit diagram illustrating a circuit configuration of a semiconductor switch in accordance with a fifth embodiment of the present invention.

FIG. 5 is a circuit diagram illustrating a circuit configuration of a semiconductor switch 1E in accordance with a fifth embodiment of the present invention.

According to FIG. 5, the semiconductor switch 1E differs from the semiconductor switch 1B described in the second embodiment in that a capacitor 10 is parallel-connected between the drain and source terminals of the low-voltage MOSFET (auxiliary element) 3. However, these semiconductor switches do not differ substantially in the other structure. Hence, components which do not substantially differ from those of the semiconductor switch 1B are denoted by like reference numerals and will not be explained again herein.

In contrast to the semiconductor switch 1B, the semiconductor switch 1E is configured by further parallel-connecting the capacitor 10 between the drain and source terminals of the low-voltage MOSFET (auxiliary element) 3, as illustrated in FIG. 5.

Hereunder, the effects of the semiconductor switch 1E configured in this way will be described. If the semiconductor switch 1E is gated off when a main current is flowing in a reverse direction, i.e., from the negative pole terminal 8 toward the positive pole terminal 7, a surge voltage is applied temporarily between the drain and source terminals of the low-voltage MOSFET (auxiliary element) 3 in a moment before the completion of commutation, as described with reference to the first embodiment. This is a matter common to the above-described semiconductor switches 1A to 1D.

A surge voltage, which is developed across both ends of the auxiliary element 3 at the moment of a transition to a gate-off state when the main current is flowing in the reverse direction, increases for a variety of reasons. For example, the surge voltage increases with an increase in wiring inductance encompassing the main element 2, the auxiliary element 3 and the high-speed freewheel diode 4. In addition, as a matter of course, the surge voltage increases as the main current increases. In addition to these reasons, the surge voltage increases even if the output junction capacitance of the auxiliary element 3 is small. Furthermore, the surge voltage also increases due to a delay time before the forward conductivity of the high-speed freewheel diode 4 recovers. Still furthermore, the surge voltage also increases if the gate resistance of the auxiliary element 3 is reduced to make a rate of reduction in the gate voltage thereof higher.

As a measure against the surge voltage which increases in this way for a variety of reasons, the semiconductor switch 1B, in which the capacitor 10 is not parallel-connected between the drain and source terminals of the low-voltage MOSFET (auxiliary element) 3, is designed to avoid element destruction in reliance on the avalanche resistance of the auxiliary element 3 against an excess voltage developed across both the ends of the auxiliary element 3. In general, in order to enhance the avalanche resistance of a MOSFET, the MOSFET needs to withstand heat generated for a short period of time. Consequently, the chip area of the auxiliary element 3 unavoidably needs to be increased for reasons of design.

On the other hand, the semiconductor switch 1E can effectively absorb the surge voltage since the capacitor 10 is parallel-connected across the auxiliary element 3. In addition, a voltage charged in the capacitor 10 at this time causes a reverse voltage to be applied to the main element 2 when the high-speed freewheel diode 4 conducts and commutation is completed. Consequently, a voltage for making a reverse recovery complete is provided to the reverse-conducting diode (parasitic diode) 6 built in the main element 2 which almost turned on momentarily.

As a result, in a bridge circuit in which two complementarily operating semiconductor switches 1E are series-connected to the DC main circuit, it is possible to reliably complete the reverse recovery of the reverse-conducting diode (parasitic diode) 6 built in the main element 2 before the other complementarily operating semiconductor switch 1E turns on.

According to the semiconductor switch 1E, it is possible to suppress a surge voltage arising in the auxiliary element 3, to reduce the chip area of the auxiliary element 3, and to configure the semiconductor switch 1E at lower costs. In addition, as the result that the wiring inductance is allowed to increase to some degree, there is no need to take a measure to reduce wiring inductance (for example, increasing the number of wirings). Thus, it is possible to configure the semiconductor switch 1E at even lower costs. Furthermore, since there is no need to consider a surge voltage arising in the auxiliary element 3, it is possible to reduce the gate resistance of the auxiliary element 3 to speed up gating-off and further shorten the dead time. Thus, it is also possible to reduce switching loss. As a result, high-speed switching becomes possible.

Further, in contrast to the semiconductor switch 1B, the semiconductor switch 1E illustrated in FIG. 5 is configured by further parallel-connecting the capacitor 10 between the drain and source terminals of the low-voltage MOSFET (auxiliary element) 3, as illustrated in FIG. 5. However, this configuration can also be applied to semiconductor switches in accordance with other embodiments (for example, the semiconductor switch 1A).

Sixth Embodiment

Figure 6:
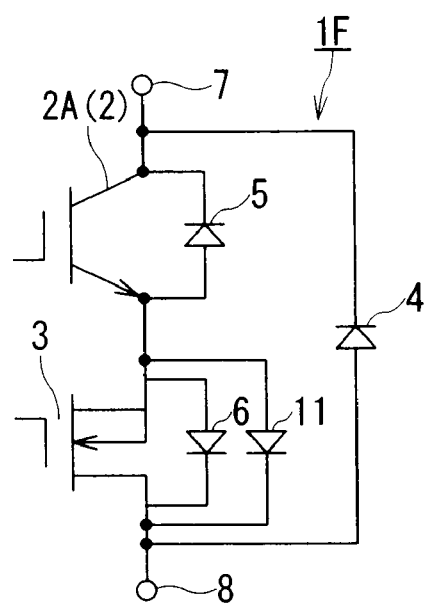
FIG. 6 is a circuit diagram illustrating a circuit configuration of a semiconductor switch in accordance with a sixth embodiment of the present invention.

FIG. 6 is a circuit diagram illustrating a circuit configuration of a semiconductor switch 1F in accordance with a sixth embodiment of the present invention.

According to FIG. 6, the semiconductor switch 1F differs from the semiconductor switch 1A described in the first embodiment in that a Schottky barrier diode 11 made of a silicon semiconducting material is further parallel-connected in a direction from the drain terminal toward the source terminal of the low-voltage MOSFET (auxiliary element) 3. However, these semiconductor switches do not differ substantially in the rest of the configuration. Hence, components which do not substantially differ from those of the semiconductor switch 1A are denoted by like reference numerals and will not be explained again herein.

In contrast to the semiconductor switch 1A, the semiconductor switch 1F is configured by further parallel-connecting the Schottky barrier diode 11 made of a silicon semiconducting material, which is one example of diodes, in a direction from the source terminal toward the drain terminal of the low-voltage MOSFET (auxiliary element) 3, as illustrated in FIG. 6. In the semiconductor switch 1F configured in this way, if the main current becomes larger while flowing in a forward direction, a voltage drop may not be kept sufficiently low by the conduction resistance of the auxiliary element 3 alone. Even in that case, it is possible to keep the voltage drop low since the main current shunts to the parallel-connected Schottky barrier diode 11.

As described above, according to the semiconductor switch 1F, it is possible to keep the voltage drop small and, therefore, reduce loss, even if the main current becomes larger while flowing in the forward direction. Consequently, it is possible to make the allowable maximum current higher.

Further, in contrast to the semiconductor switch 1A, the semiconductor switch 1F illustrated in FIG. 6 is configured by further parallel-connecting a diode (Schottky barrier diode 11) between the drain and source terminals of the low-voltage MOSFET (auxiliary element) 3. However, this configuration may also be applied to semiconductor switches in accordance with other embodiments (for example, the semiconductor switch 1B).

In addition, the number of diodes (Schottky barrier diodes 11) (i.e., the number of parallel connections) is not limited to one, and the number of parallel connections may be at least one.

Seventh Embodiment

Figure 7:
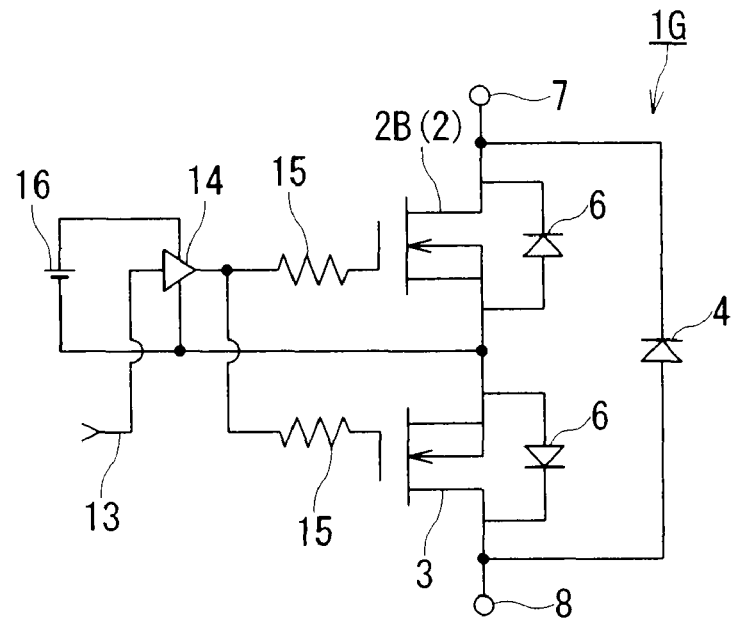
FIG. 7 is a circuit diagram illustrating a circuit configuration of a semiconductor switch in accordance with a seventh embodiment of the present invention.

FIG. 7 is a circuit diagram illustrating a circuit configuration of a semiconductor switch 1G in accordance with a seventh embodiment of the present invention.

According to FIG. 7, the semiconductor switch 1G differs from the semiconductor switch 1B described in the second embodiment in that a gate control circuit and a gate drive circuit are added. However, these semiconductor switches do not differ substantially in the other structure. Hence, components which do not substantially differ from those of the semiconductor switch 1B are denoted by like reference numerals and will not be explained again herein.

In contrast to the semiconductor switch 1B configured by including the main element 2, the auxiliary element 3 and the high-speed freewheel diode 4, the semiconductor switch 1G is configured by adding the gate control circuit and the gate drive circuit configured so that an output from a gate driver 14, to which a common gate signal 13 is input, is supplied to the gate terminals of the main element 2 and the auxiliary element 3 through gate resistors 15, as illustrated in FIG. 7. Here, reference numeral 16 denotes a gate-driving power supply for supplying gate-driving power to the gate driver 14.

In the semiconductor switch 1G configured in this way, the gate driver 14, to which a common gate signal 13 is input, is enabled upon receiving a supply of power from the gate-driving power supply 16. The gate driver 14 supplies the output thereof to the gate terminals of the main element 2 and the auxiliary element 3 through the gate resistors 15. That is, the main element 2 and the auxiliary element 3 are driven by the gate control circuit and the gated drive circuit composed, in an extremely simplified manner, of the single and common gate signal 13, the gate driver 14, the gate-driving power supply 16 and the two gate resistors 15. The subsequent operation of the semiconductor switch 1G is the same as that of the semiconductor switch 1B.

According to the semiconductor switch 1G, it is possible to drive the main element 2 and the auxiliary element 3 by the gate control circuit and the gate drive circuit composed, in an extremely simplified manner, of the single and common gate signal 13, the gate driver 14, the gate-driving power supply 16 and the two gate resistors 15. That is, it is possible to realize a small-size, low-cost gate control circuit and gate drive circuit.

Further, the semiconductor switch 1G illustrated in FIG. 7 is configured by including only one gate-driving power supply 16. Alternatively, there may be added a negative-biasing power supply intended to apply a negative voltage to the gate terminals of the main element 2 and the auxiliary element 3, for the purpose of speeding up gating-off and preventing false operation due to noise or the like at the gating-off time.

Furthermore, in contrast to the semiconductor switch 1B described in the second embodiment, the semiconductor switch 1G illustrated in FIG. 7 is configured by adding the gate control circuit and the gate drive circuit. Alternatively, the semiconductor switch 1G may be configured by adding the gate control circuit and the gate drive circuit to semiconductor switches in accordance with other embodiments (for example, the semiconductor switch 1A).

Eighth Embodiment

Figure 8:
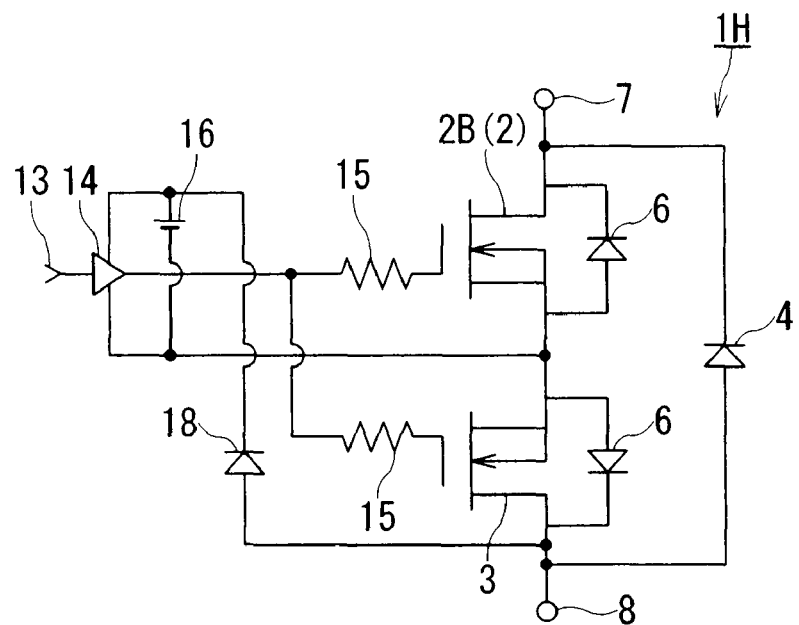
FIG. 8 is a circuit diagram illustrating a circuit configuration of a semiconductor switch in accordance with an eighth embodiment of the present invention.

FIG. 8 is a circuit diagram illustrating a circuit configuration of a semiconductor switch 1H in accordance with an eighth embodiment of the present invention.

According to FIG. 8, the semiconductor switch 1H differs from the semiconductor switch 1G described in the seventh embodiment in that a voltage clamping circuit comprised of a diode 18 and the like is further connected in a direction from the negative pole terminal 8 to the positive side of the gate-driving power supply 16 which is a power supply of the gate driver 14. However, these semiconductor switches do not differ substantially in the other structure. Hence, components which do not substantially differ from those of the semiconductor switch 1G are denoted by like reference numerals and will not be explained again herein.

In contrast to the semiconductor switch 1G configured by including the main element 2, the auxiliary element 3, the high-speed freewheel diode 4, the gate driver 14 to which the common gate signal 13 is input, and the gate resistor 15, the semiconductor switch 1H is configured by further connecting the voltage clamping circuit comprised of the diode 18 and the like in a direction from the negative pole terminal 8 to the positive side of the gate-driving power supply 16 which a power supply of the gate driver 14, as illustrated in FIG. 8.

In the semiconductor switch 1H configured in this way, the power consumption of the gate-driving power supply can be reduced since it is possible to utilize, as a gate-driving power supply, the energy of a surge voltage developed across the auxiliary element 3 at the moment the semiconductor switch 1H is gated off when a main current is flowing in a reverse direction, thereby providing further advantage in addition to the actions and effects of the semiconductor switch 1G.

In addition, since a surge voltage arising in the auxiliary element 3 can be suppressed, it is possible to reduce the chip area of the auxiliary element 3. Furthermore, since there is no need to take a measure to reduce wiring inductance, it is possible to configure the semiconductor switch 1H at even lower costs. Still furthermore, it is possible to speed up the gating-off of the auxiliary element 3 and, therefore, shorten a dead time. Thus, switching loss is reduced and, consequently, high-speed switching becomes possible.

Ninth Embodiment

Figure 9:
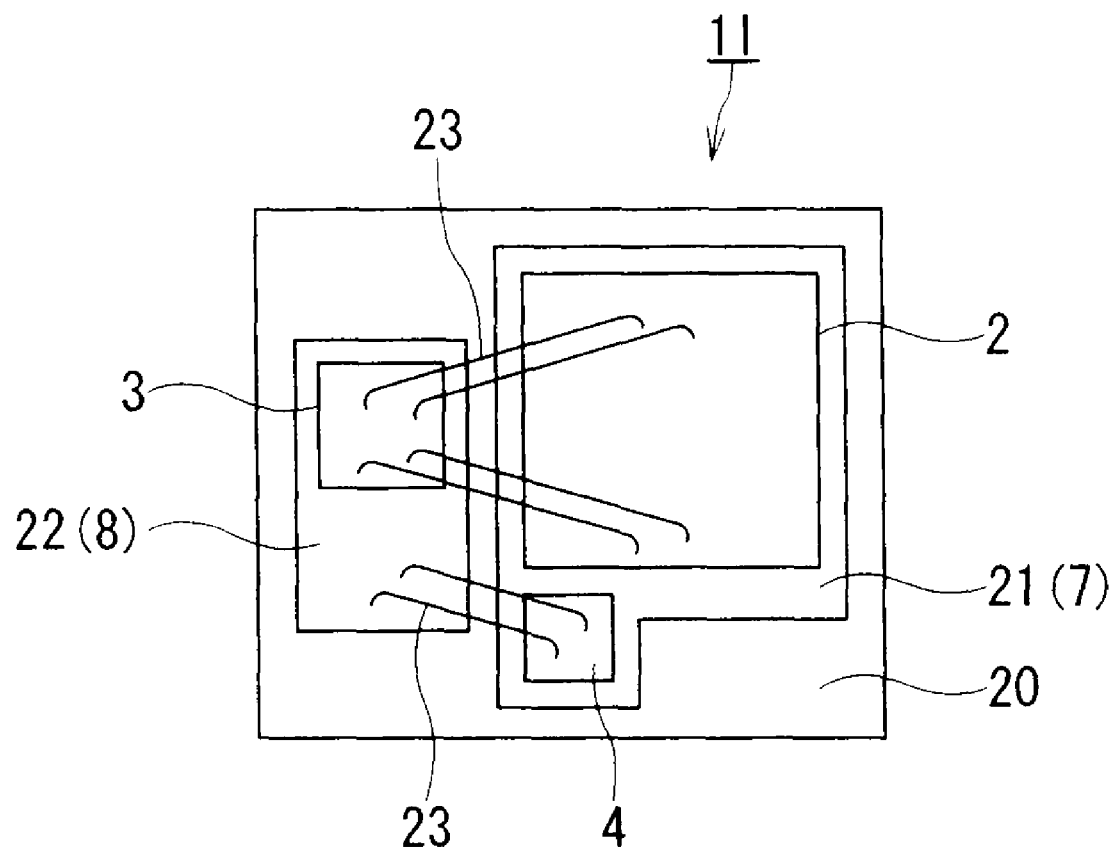
FIG. 9 is a schematic view illustrating a circuit configuration of a semiconductor switch in accordance with a ninth embodiment of the present invention.

FIG. 9 is a schematic view illustrating a circuit configuration of a semiconductor switch 1I in accordance with a ninth embodiment of the present invention. Further, it is to be noted that a circuit diagram corresponding to the semiconductor switch 1I illustrated in FIG. 9 is the circuit diagram of FIG. 2. That is, the semiconductor switch 1I is a semiconductor switch 1B in which a contrivance is made in the arrangement and wiring of various elements.

According to FIG. 9, a copper substrate (hereinafter referred to as the positive pole substrate) 21 serving as the positive pole terminal 7 and a copper substrate (hereinafter referred to as the negative pole substrate) 22 serving as the negative pole terminal 8 are disposed on a substrate 20 made of an insulator. The two copper substrates 21 and 22 are disposed slightly away from each other at a minimum distance necessary for securing required insulation.

In the semiconductor switch 1I illustrated in FIG. 9, the main element 2 and the high-speed freewheel diode 4 are mounted on the positive pole substrate 21. The main element 2 and the high-speed freewheel diode 4 are disposed close to each other so as to reduce inductance produced therebetween. The rear surface of the semiconductor chip of the main element (MOSFET) 2 is a drain terminal and is connected to the positive pole substrate 21. The rear surface of the semiconductor chip of the high-speed freewheel diode 4 is a cathode (negative electrode) and is connected to the positive pole substrate 21. In addition, the auxiliary element 3 is mounted on the negative pole substrate 22. The rear surface of the semiconductor chip of the auxiliary element (low-voltage MOSFET) 3 is a drain terminal and is connected to the negative pole substrate 22.

Both a surface of the semiconductor chip of the main element (MOSFET) 2 and a surface of the semiconductor chip of the auxiliary element 3 are source terminals. The two surfaces are bridged with an electric wire 23 and are thereby electrically connected to each other. A surface of the semiconductor chip of the high-speed freewheel diode 4 is an anode (positive electrode). The surface is bridged to the negative pole substrate 22 with an electric wire 23 and is thereby electrically connect thereto.

In the semiconductor switch 1I configured in this way, the semiconductor chips of the main element 2, auxiliary element 3 and high-speed freewheel diode 4 are formed in an integral manner on the single substrate 20. As a result, wiring inductance encompassing the main element 2, the auxiliary element 3 and the high-speed freewheel diode 4 decreases. Thus, it is possible to further suppress a surge voltage developed across the drain and source terminals of the auxiliary element (low-voltage MOSFET) 3 at the moment of gating-off when a main current is flowing in a reverse direction.

Further, since it is also possible to suppress a surge voltage arising in the auxiliary element 3, it is possible to reduce the chip area of the auxiliary element 3 and, therefore, speed up the gating-off of the auxiliary element 3. As the result of being able to speed up the gating-off of the auxiliary element 3, the dead time can be shortened. This in turn makes it possible to reduce switching loss. Consequently, high-speed switching becomes possible.

Tenth Embodiment

Figure 10:
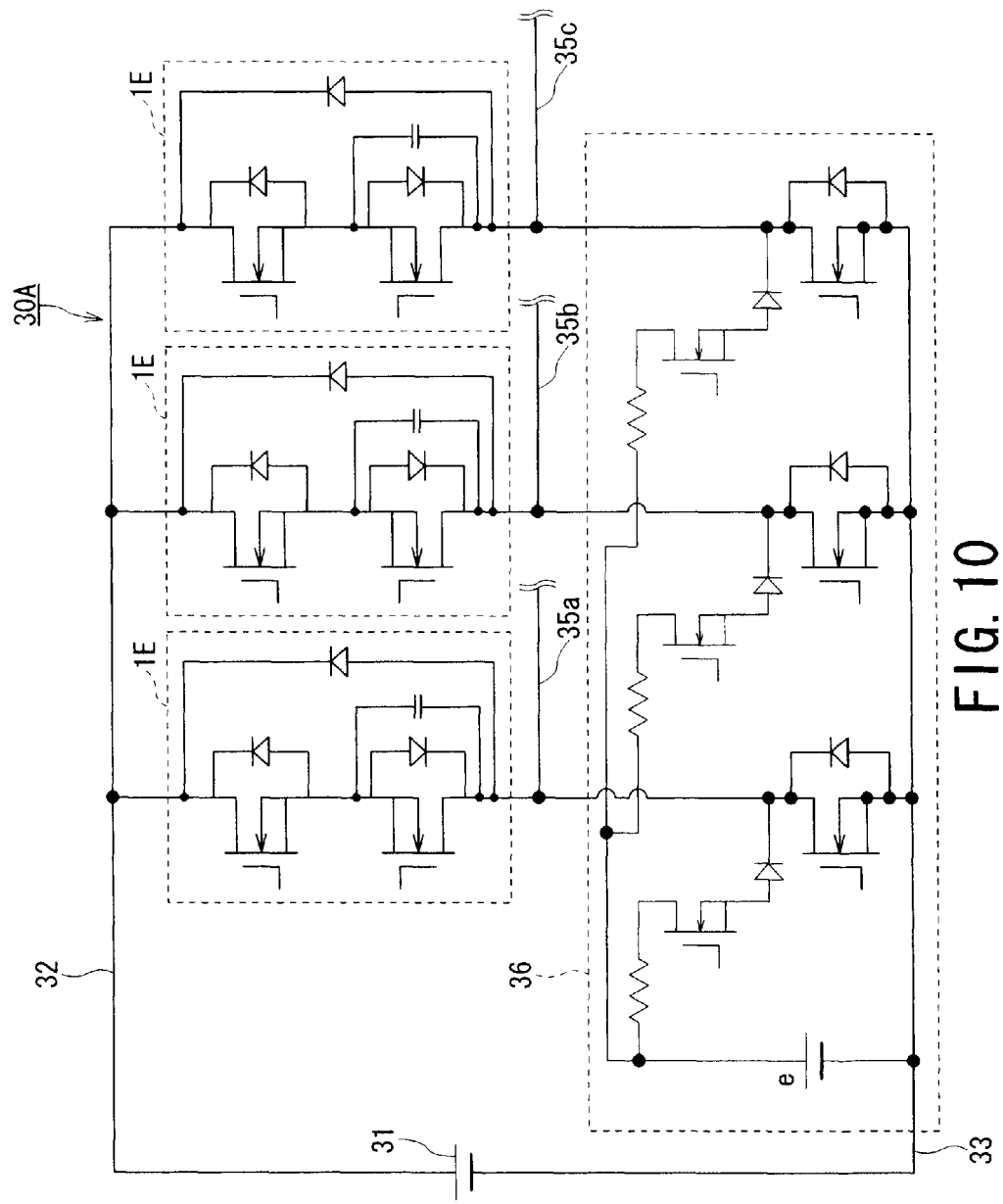
FIG. 10 is a circuit diagram illustrating a circuit configuration a first power conversion system in accordance with the present invention (a power conversion system configured by applying a semiconductor switch in accordance with the present invention).

FIG. 10 is a circuit diagram illustrating a circuit configuration of a first power conversion system 30A which is one example of a power conversion system provided with the semiconductor switches in accordance with the embodiments of the present invention.

As illustrated in FIG. 10, the first power conversion system 30A is a three-phase bridge circuit in which there are arranged three bridges, each being configured by series-connecting two main-circuit switching elements between a positive-side DC bus line 32 and a negative-side DC bus line 33 extending from a DC main power supply 31. A connection (junction) point between each positive-side switching element and each negative-side switching element is an output terminal 35, and the three phases correspond to output terminals 35a, 35b and 35c, respectively.

More specifically, the first power conversion system 30A is configured in the manner that as the main-circuit switching elements, semiconductor switches 1E (illustrated in FIG. 5), each of which is one example of a semiconductor switch in accordance with the present invention, are applied to the three switching elements on the positive side (on the side of the positive-side DC bus line 32), and on the other hand, a semiconductor switch 36, which is shown in the seventh embodiment in Patent Document 2 (Japanese Patent Laid-Open No. 2006-141168) as one example of a conventional semiconductor switch, is applied to the three switching elements on the negative side (on the side of the negative-side DC bus line 33). It is further to be noted that the DC main power supply 31 can be obtained by, for example, rectifying the output of a three-phase AC power supply and smoothing the rectified output with a capacitor.

With the first power conversion system 30A configured in this way, it is possible to realize a high-efficiency (low-loss), low-cost power conversion system capable of high-speed switching by arranging the semiconductor switches 1E having an extremely low conduction voltage and capable of high-speed switching on the positive side. In addition, the semiconductor switch 1E has an advantage, which is not obtainable by conventional power conversion systems, such that there is no need for an additional auxiliary power supply, thereby eliminating the need for preparing a separate power supply having the respective phases insulated and isolated from one another.

Furthermore, the first power conversion system 30A illustrated in FIG. 10 is configured by applying the semiconductor switch 1E to the three switching elements on the positive side (on the side of the positive-side DC bus line 32) and the semiconductor switch 36 to the three switching elements on the negative side (on the side of the negative-side DC bus line 33). Alternatively, the semiconductor switches in accordance with the other embodiments (for example, the semiconductor switch 1A) may be applied.

It also is to be noted that the description given in the present embodiment neither limits the three switching elements on the negative side (on the side of the negative-side DC bus line 33) to conventional semiconductor switches, nor prohibits the application of semiconductor switches in accordance with the present invention (for example, the semiconductor switch 1A). Furthermore, although a three-phase bridge circuit has been taken as an example of the first power conversion system 30A illustrated in FIG. 10, the first power conversion system 30A may be also applied to not only a multiphase bridge circuit but also a single-phase bridge circuit.

Eleventh Embodiment

Figure 11:
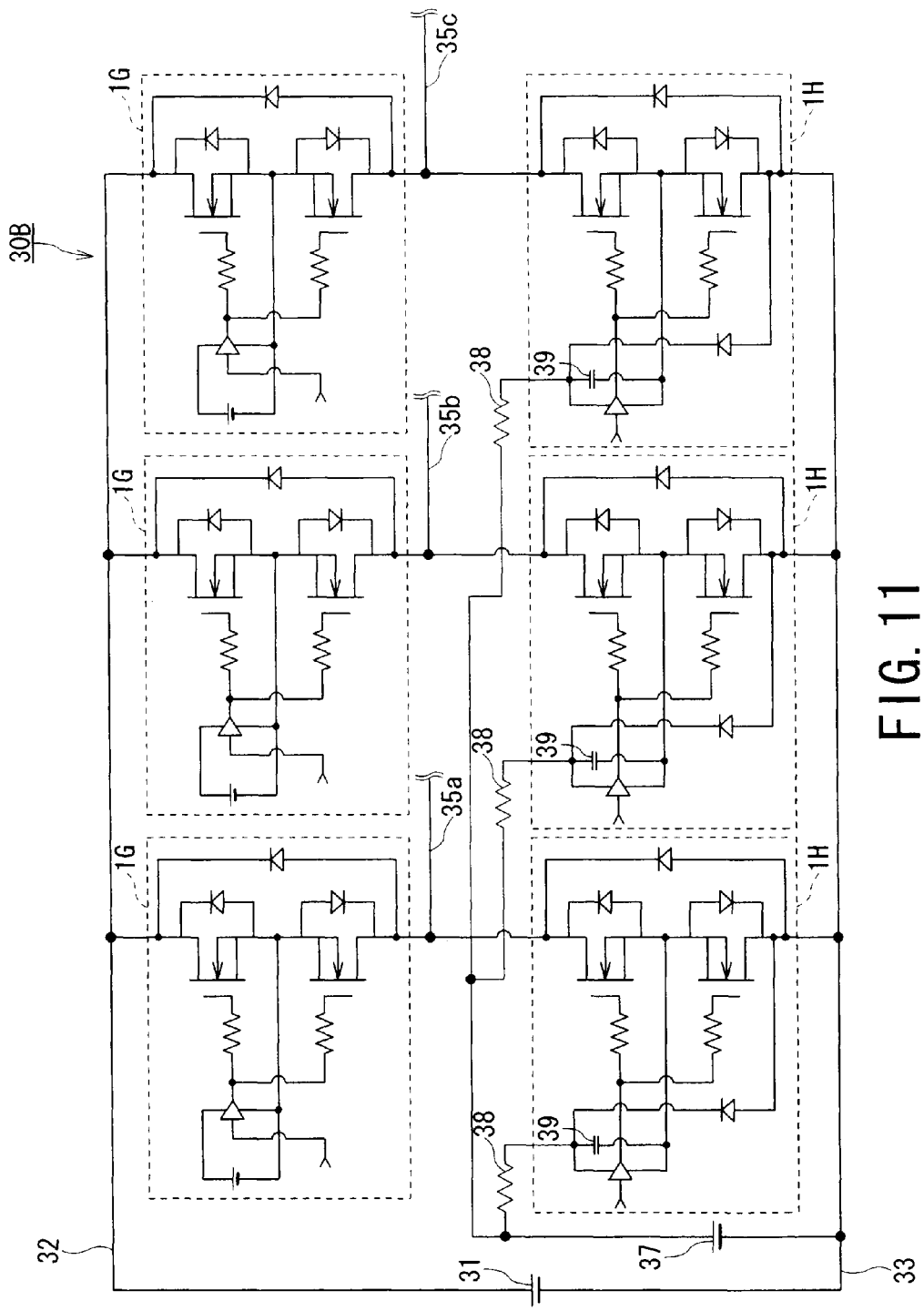
FIG. 11 is a circuit diagram illustrating a circuit configuration of a second power conversion system in accordance with the present invention (a power conversion system configured by applying a semiconductor switch in accordance with the present invention).

FIG. 11 is a circuit diagram illustrating a circuit configuration of a second power conversion system 30B (a power conversion system configured by applying semiconductor switches in accordance with the present invention) which is one example of a power conversion system in accordance with an embodiment of the present invention.

As is the case with FIG. 10, the second power conversion system 30B illustrated in FIG. 11 is also a three-phase bridge circuit in which there are arranged three bridges, each being configured by series-connecting two main-circuit switching elements between a positive-side DC bus line 32 and a negative-side DC bus line 33 extending from a DC main power supply 31. A connection point between each positive-side switching element and each negative-side switching element is an output terminal 35, and the three phases correspond to output terminals 35a, 35b and 35c, respectively.

More specifically, in the second power conversion system 30B, the semiconductor switch 1G (illustrated in FIG. 7) is applied to the three switching elements on the positive side (on the side of the positive-side DC bus line 32) and the semiconductor switch 1H (illustrated in FIG. 8) is applied to the three switching elements on the negative side (on the side of the negative-side DC bus line 33). Power is supplied from a common gate-driving power supply 37 of the respective negative-side switching elements (semiconductor switches 1H) to each phase through each current-controlling resistor 38. Since a gate-driving power supply 16 is made common, the gate-driving power supply 16 of each semiconductor switch 1H illustrated in FIG. 11 has been changed to a capacitor 39.

In the second power conversion system 30B configured in this way, semiconductor switches in accordance with the present invention (semiconductor switches 1G and 1H in the example illustrated in FIG. 11) capable of higher-speed switching, more than conventional technology, are arranged on both the positive side and the negative side. Accordingly, in addition to the advantages of the first power conversion system 30A, it is possible to make switching speed higher, compared with the first power conversion system 30A. In addition, since it is possible to utilize the energy of a surge voltage as a gate-driving power supply, the power consumption of the gate-driving power supply can be reduced.

Further, in the second power conversion system 30B illustrated in FIG. 11, the semiconductor switch 1G (illustrated in FIG. 7) is applied to the three switching elements on the positive side (on the side of the positive-side DC bus line 32) and the semiconductor switch 1H (illustrated in FIG. 8) is applied to the three switching elements on the negative side (on the side of the negative-side DC bus line 33). However, semiconductor switches of the present invention to be applied are not limited to these semiconductor switches. For example, the semiconductor switch 1H (illustrated in FIG. 8) may be applied to the six switching elements on the positive side (on the side of the positive-side DC bus line 32) and on the negative side (on the side of the negative-side DC bus line 33).

Twelfth Embodiment

Figure 12:
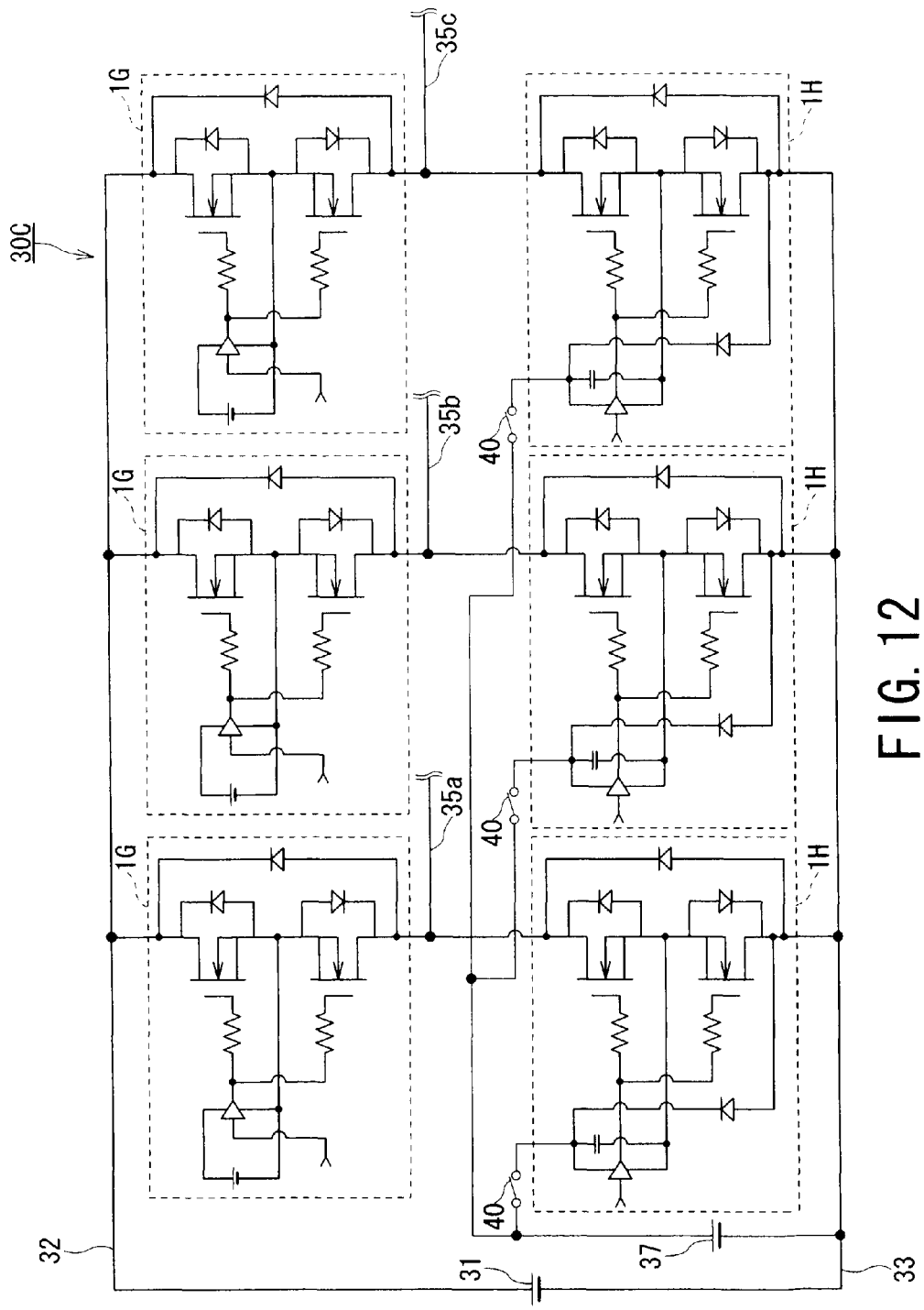
FIG. 12 is a circuit diagram illustrating a circuit configuration of a third power conversion system in accordance with the present invention (a power conversion system configured by applying a semiconductor switch in accordance with the present invention).

FIG. 12 is a circuit diagram illustrating a circuit configuration of a third power conversion system 30C (a power conversion system configured by applying semiconductor switches in accordance with the present invention) which is one example of a power conversion system in accordance with an embodiment of the present invention.

The third power conversion system 30C differs from the second power conversion system 30B (illustrated in FIG. 11) in that the third power conversion system 30C includes a charging switch 40 in place of the resistor 38. However, these power conversion systems do not differ substantially in the rest of the configuration. Hence, components which do not substantially differ from those of the power conversion system 30B are denoted by like reference numerals and will not be explained again herein.

As is the case with FIG. 11, the third power conversion system 30C illustrated in FIG. 12 is also a three-phase bridge circuit in which there are arranged three bridges, each being configured by series-connecting two main-circuit switching elements between a positive-side DC bus line 32 and a negative-tive-side DC bus line 33 extending from a DC main power supply 31. A connection point between each positive-side switching element and each negative-side switching element is an output terminal 35, and the three phases correspond to output terminals 35a, 35b and 35c, respectively.

More specifically, the semiconductor switch 1G (illustrated in FIG. 7) is applied to the three switching elements on the positive side (on the side of the positive-side DC bus line 32) and the semiconductor switch 1H (illustrated in FIG. 8) is applied to the three switching elements on the negative side (on the side of the negative-side DC bus line 33). In addition, power is supplied from a common gate-driving power supply 37 of the respective negative-side semiconductor switches 1H (on the side of the negative-side DC bus line 33) to each phase through each charging switch 40.

In the third power conversion system 30C configured in this way, each charging switch 40 is synchronized with the on/off timing of an in-phase main element 2 and auxiliary element 3. More specifically, the charging switch 40 is turned on only when the in-phase main element 2 and auxiliary element 3 are turned on.

According to the third power conversion system 30C, a further advantage is provided in addition to the advantages of the second power conversion system 30B. That is, it is possible to reduce loss more than in the case of using the resistor 38 in the second power conversion system 30B, by controlling the on/off timing of the charging switch 40. Consequently, it is possible to configure the circuit of the third power conversion system 30C to be smaller in size than the circuit of the second power conversion system 30B. Likely, as is the case with the second power conversion system 30B, the semiconductor switches of the present invention applied in the third power conversion system 30C illustrated in FIG. 12 are not limited to those illustrated in the figure.

Thirteenth Embodiment

Figure 13:
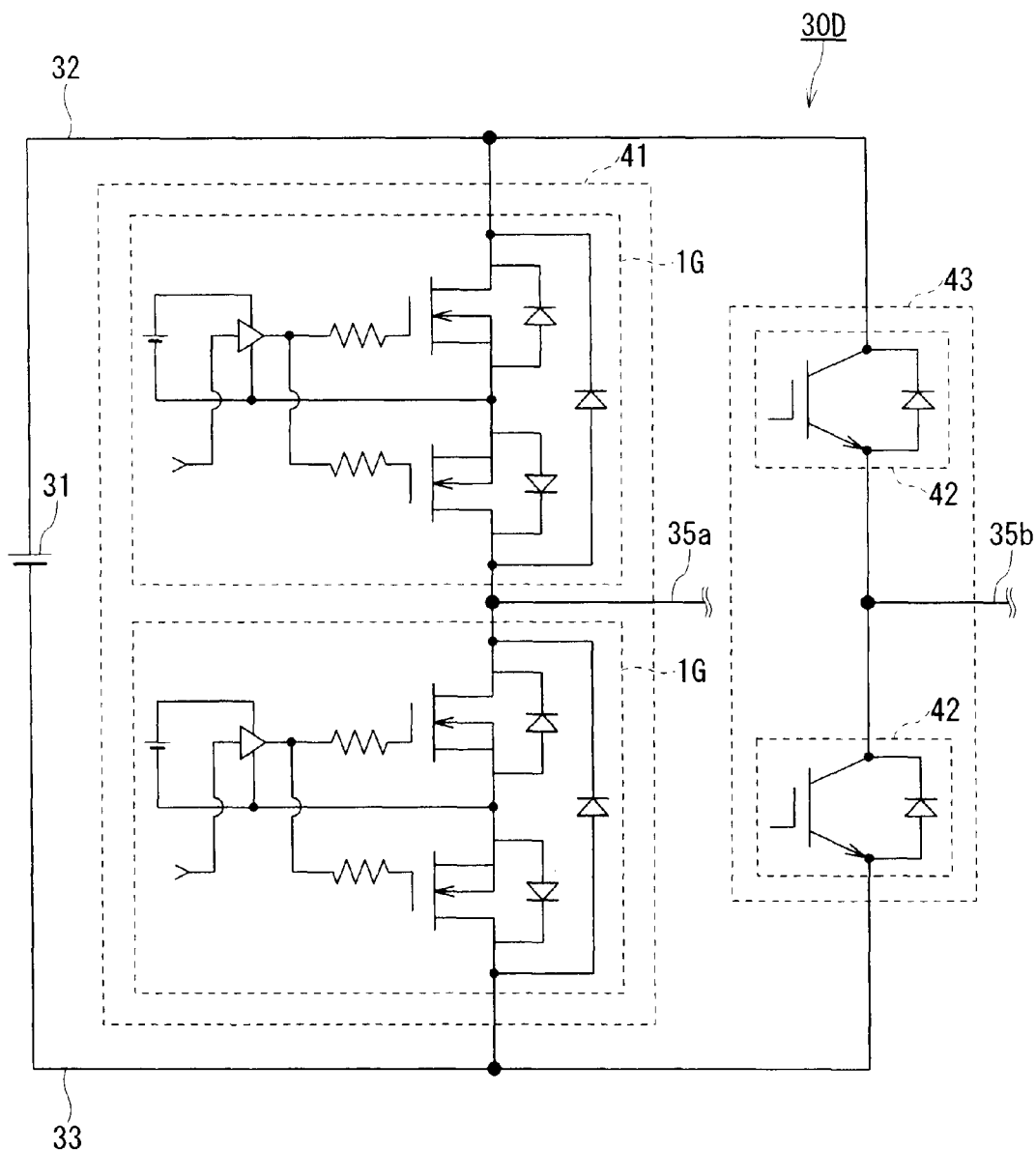
FIG. 13 is a circuit diagram illustrating a circuit configuration of a fourth power conversion system in accordance with the present invention (a power conversion system configured by applying a semiconductor switch in accordance with the present invention).

FIG. 13 is a circuit diagram illustrating a circuit configuration of a fourth power conversion system 30D (a power conversion system configured by applying a semiconductor switch in accordance with the present invention) which is one example of a power conversion system in accordance with an embodiment of the present invention.

As illustrated in FIG. 13, the fourth power conversion system 30D is a single-phase full bridge circuit in which there are arranged two bridges, each being configured by series-connecting two main-circuit switching elements between a positive-side DC bus line 32 and a negative-side DC bus line 33 extending from a DC main power supply 31.

For one of the two bridges, there is configured a high-speed switching bridge circuit 41 in which the semiconductor switch 1G, which is one example of a semiconductor switch in accordance with the present invention, is applied as the switching elements on the positive side (on the side of the positive-side DC bus line 32) and on the negative side (on the side of the negative-side DC bus line 33). For the other bridge, there is configured a low-speed switching bridge circuit 43 in which an IGBT 42, which is a conventional switching element, is applied as the switching elements on the positive side (on the side of the positive-side DC bus line 32) and on the negative side (on the side of the negative-side DC bus line 33).

The fourth power conversion system 30D configured in this way is operated so that the switching frequency of the high-speed switching bridge circuit 41 is higher than that of the low-speed switching bridge circuit 43. By performing operation control in this way, it is possible to realize a power conversion system capable of high-speed switching with efficiency higher in comparison with conventional technology, with lower-cost and simpler circuit configuration.

Further, although an explanation has been made of an example in which the fourth power conversion system 30D illustrated in FIG. 13 is a single-phase full bridge circuit, the fourth power conversion system 30D is not limited to the single-phase full bridge circuit. Alternatively, the fourth power conversion system 30D may be a bridge circuit including a plurality of bridges configured by series-connecting two main-circuit switching elements and having at least one high-speed switching bridge circuit 41. For example, the fourth power conversion system 30D may be any one of the three-phase bridge circuits illustrated in FIGS. 10 to 12.

As mentioned hereinabove, according to the present invention, it is possible to more effectively suppress the reverse recovery current of a freewheel diode, while making a circuit configuration simpler than the conventional technology. Accordingly, it is possible to provide a semiconductor switch further reduced in loss, and a power conversion system applying the semiconductor switch. In addition, since the present invention is free from conventional constraints on switching timing, it is possible to provide a semiconductor switch higher in switching speed in comparison with the conventional technology, and a power conversion system applying the semiconductor switch. It should be noted that the present invention is not limited to the above-described respective embodiments as they are, and in a practical use, constituent elements may be modified and embodied without departing from the subject matter of the present invention.

The invention claimed is:

1. A semiconductor switch comprising:
a main element having reverse conductivity and serving as a voltage-driven switching element having a high withstand voltage;
an auxiliary element serving as a voltage-driven switching element having a withstand voltage lower than that of the main element; and
a high-speed freewheel diode having a withstand voltage equal to that of the main element;
wherein a negative pole of the main element is connected to a negative pole of the auxiliary element to define a positive pole of the main element as a positive pole terminal and a positive pole of the auxiliary element as a negative pole terminal, and the high-speed freewheel diode is parallel-connected between the positive pole terminal and the negative pole terminal so that a direction from the negative pole terminal toward the positive pole terminal constitutes a forward direction.

2. The semiconductor switch according to claim 1, wherein the main element is a MOSFET.

3. The semiconductor switch according to claim 1, wherein the auxiliary element is comprised of a FET.

4. The semiconductor switch according to claim 1, wherein the high-speed freewheel diode is configured by series-connecting a plurality of high-speed freewheel diodes in order to realize a withstand voltage equal to that of the main element.

5. The semiconductor switch according to claim 1, wherein the high-speed freewheel diode is a diode manufactured by using a semiconductor material with a forbidden band wider than that of silicon.

6. The semiconductor switch according to claim 1, wherein a capacitor is connected in parallel across both ends of the positive and negative poles of the auxiliary element.

7. The semiconductor switch according to claim 1, wherein a diode, in which a forward direction thereof is a direction from the negative pole toward the positive pole of the auxiliary element, is connected in parallel across the positive and negative poles of the auxiliary element.

8. The semiconductor switch according to claim 1, wherein an output side of a gate driver, to which a common gate signal is input, is connected to the gate terminals of the main element and the auxiliary element.

9. The semiconductor switch according to claim 8, wherein a voltage clamping circuit is connected in a direction from the negative pole terminal to the positive pole side of a power supply of the gate driver.

10. The semiconductor switch according to claim 1, wherein semiconductor chips of the main element, the auxiliary element and the high-speed freewheel diode are integrally formed on a single substrate.

11. A power conversion system, wherein in a bridge circuit configured by series-connecting two switching elements to a DC main power supply, at least a switching element on the positive pole side of the two switching elements is configured by applying any one of the semiconductor switches according to claims 1 to 10.

12. A power conversion system, wherein in a multiphase bridge circuit having a plurality of bridge circuits, each being configured by series-connecting two switching elements to a DC main power supply, at least a switching element on the negative pole side of the two switching elements is configured by applying any one of the semiconductor switches according to claims 1 to 10, and the gate-driving power supply of the switching element on the negative pole side is made common so that power is supplied to each phase from a single power supply through a resistor.

13. A power conversion system, wherein in a multiphase bridge circuit having a plurality of bridge circuits, each being configured by series-connecting two switching elements to a DC main power supply, at least a switching element on the negative pole side of the two switching elements is configured by applying any one of the semiconductor switches according to claims 1 to 10, and the gate-driving power supply of the switching element on the negative pole side is made common so that power is supplied to each phase from a single power supply through a switch.

14. A power conversion system, wherein in a bridge circuit having at least two bridge circuits, each being configured by series-connecting two switching elements to a DC main power supply, at least one of the bridge circuits is configured by applying any one of the semiconductor switches according to claims 1 to 10 to the two switching elements so that the switching frequency of the bridge circuit is higher than that of other bridge circuits.

* * * * *